United States Patent [19]

Plichta et al.

[11] 4,301,192
[45] Nov. 17, 1981

[54] METHOD FOR COATING THRU HOLES IN A PRINTED CIRCUIT SUBSTRATE

[75] Inventors: George J. Plichta, Woodbridge Township, Middlesex County; Thomas E. Unger, Chatham, both of N.J.

[73] Assignee: Western Electric Co., Inc., New York, N.Y.

[21] Appl. No.: 155,246

[22] Filed: Jun. 2, 1980

[51] Int. Cl.³ .......................... H05K 3/42; H05K 3/12
[52] U.S. Cl. ........................ 427/97; 29/852; 427/123; 427/230; 427/238; 427/282; 427/284
[58] Field of Search ................ 427/97, 230, 238, 123, 427/282, 284; 29/852; 118/408, 215, 241, 242

[56] References Cited
U.S. PATENT DOCUMENTS

| | | |
|---|---|---|
| 3,121,020 | 2/1964 | Low . |
| 3,158,503 | 11/1964 | Young ................................ 427/97 |
| 3,301,175 | 1/1967 | Polichette ......................... 101/316 |
| 3,357,856 | 12/1967 | Ragan et al. ....................... 427/97 |
| 3,576,669 | 4/1971 | Filip .................................. 427/97 |
| 3,604,391 | 9/1971 | Mallia et al. ..................... 118/215 |
| 4,024,629 | 5/1977 | Lemoine et al. .................. 427/97 |

Primary Examiner—John D. Smith
Attorney, Agent, or Firm—J. J. Jordan

[57] ABSTRACT

The walls 41 (FIG. 4) of thru holes 11 in a printed wiring board substrate 12 are coated with a liquid 24 by inserting fingers 22 into the thru holes. Each of the fingers has a diameter slightly less than the diameter of the associated thru hole and has a length no greater than the thickness of the substrate 12. After ink 24 has been applied to the top surface of the substrate, the inserted fingers 22 are withdrawn, thereby drawing the ink down into the thru holes and coating the walls 41. In another embodiment, fingers 62 are aligned with selected portions 52 of an edge 55 of the substrate 50 to coat the portions of the edge as the fingers are moved by the edge after the heads of the fingers have been coated with the ink 24.

10 Claims, 8 Drawing Figures

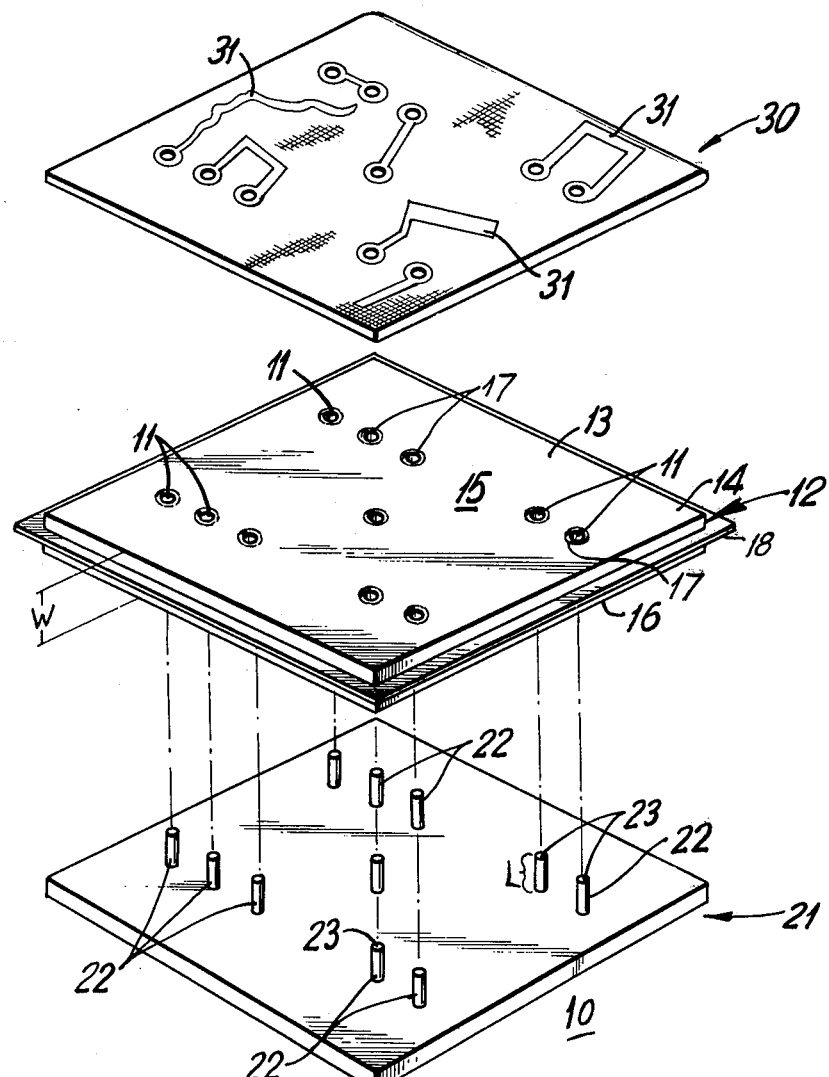
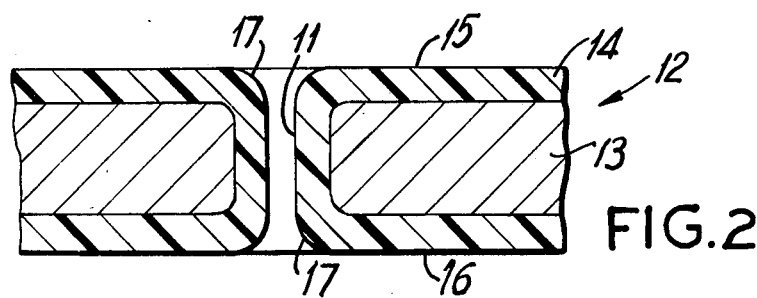
FIG.1
FIG.2

METHOD FOR COATING THRU HOLES IN A PRINTED CIRCUIT SUBSTRATE

TECHNICAL FIELD

This invention relates generally to methods for coating surfaces in a substrate, and, more particularly, to methods for coating the walls of thru holes in a printed wiring board substrate with ink.

BACKGROUND OF THE INVENTION

In the manufacture of printed wiring boards, such as boards having an epoxy coated metal substrate, an inked circuit configuration is applied to a surface of the substrate; the ink acting as a catalyst for accelerating the adherence of copper onto the substrate's surface during a later step in the manufacturing process. One of the methods for applying an inked circuit configuration onto a substrate surface involves a screen process using a silk screen having thin screen areas, called land areas or pads, representing the circuit configuration to be applied to the substrate's surface, and thick screen areas surrounding the land areas. In this process, the screen is placed over the surface of the printed wiring board substrate, ink is poured on the screen, and a squeegee is then moved over the screened surface forcing the ink through the thin screened, or land, areas onto the printed wiring board surface. When the screen is removed from the surface, an inked circuit configuration conforming to the land areas of the silk screen remains on the substrate's surface.

Often printed circuit board substrates have thru holes drilled in the substrate to allow for electrical connection between circuits appearing on the top and bottom surfaces of the substrate. In order for good electrical connections to be formed in the holes during a later step in the manufacturing process, the walls of each hole must be coated with ink. The above silk screening method, however, does not allow for the inking of the walls or sides of thru holes which appear in the printed wiring board substrate. To ink the walls of thru holes, the printed wiring board typically undergoes another step in the manufacturing process called "ball printing", which step is normally applied prior to the silk screening step.

Ball printing involves the use of a plate having pins extending vertically from the plate. Each pin is located on the plate so that it is aligned with a corresponding thru hole in the printed wiring board substrate. The diameter of each pin is slightly (a few mils) greater than the diameter of its corresponding thru hole.

The heads of the pins are dunked into a bath of ink and the plate is then properly aligned over the substrate with each inked pin located directly over its corresponding thru hole. The plate is lowered until the ink covered head of each pin rests in each hole. Since the pin diameter is only slightly greater than the hole diameter, the pin rests in the crater or lip of the hole and does not enter the hole. The plate is removed, leaving a bubble, or ball, of ink covering each hole and, by applying a vacuum to the bottom of the printed wiring board substrate, the ink is then sucked down through and covers the walls of the hole.

Ball printing, as described above, involves an additional step in the manufacturing process of the printed wiring board and thus adds time and expense to the process, resulting in a more costly printed wiring board.

Additionally, it is frequently required to have an electrical circuit connection extend around the edge of a printed wiring board substrate for interconnecting the circuits appearing on each side of the substrate. "Ball printing," as described above, will not apply ink to the edges of the substrate and the edge is presently coated with ink by an operator hand brushing the ink onto the edge.

SUMMARY OF THE INVENTION

In accordance with the foregoing discussion, certain specific objectives of the invention are to provide new and improved methods for coating thru holes in an article such as a printed wiring board substrate.

Another object is to provide methods for coating thru holes in a printed wiring board substrate during the ink screening process in the manufacture of the substrate.

A still further object is to coat the walls of thru holes without using the "ball printing" step described above.

An additional object is to provide methods for coating the edge of an article, such as a printed circuit board substrate.

With the foregoing and other objects in view, methods and in accordance with certain features of the invention involve coating the walls of thru holes in a substrate with a liquid by inserting fingers, or pins, into the thru holes, applying the liquid to the top surface of the substrate and removing the fingers thereby drawing the liquid into the thru holes and coating the walls of the thru holes.

The coating apparatus includes a base having fingers extending from the top surface of the base. The fingers are located on the base so that they are aligned with corresponding ones of the thru holes in the substrate, have a diameter which is slightly less than the diameter of the associated thru holes, and have a height no greater than the thickness of the substrate. After the top surface of the substrate and the heads of the inserted fingers have been coated with the liquid, the fingers are removed from the thru holes thereby drawing the liquid down into the holes and coating the walls of the holes.

In a particular embodiment of the invention, fingers are located on the base so that they are aligned with thru holes and also with portions of an edge of the substrate on which portions ink is to be coated. After coating the top surface of the substrate and the heads of the inserted fingers and edge aligned fingers with ink, the fingers are removed thereby coating the walls of the thru holes and the portions of the edge of the substrate with which the fingers come into contact.

BRIEF DESCRIPTION OF THE DRAWINGS

Other objects, features and advantages of the invention, its organization, construction, and operation will be best understood from the following detailed description of a specific embodiment thereof, taken in conjunction with the accompanying drawings in which:

FIG. 1 is a perspective view of a printed wiring board substrate, silk screen, and apparatus for coating the thru holes in the substrate, with these elements aligned over each other but apart from each other for easier viewing.

FIG. 2 is an enlarged view of a vertical section of the substrate showing a thru hole formed in the substrate.

DETAILED DESCRIPTION

Figure 3:
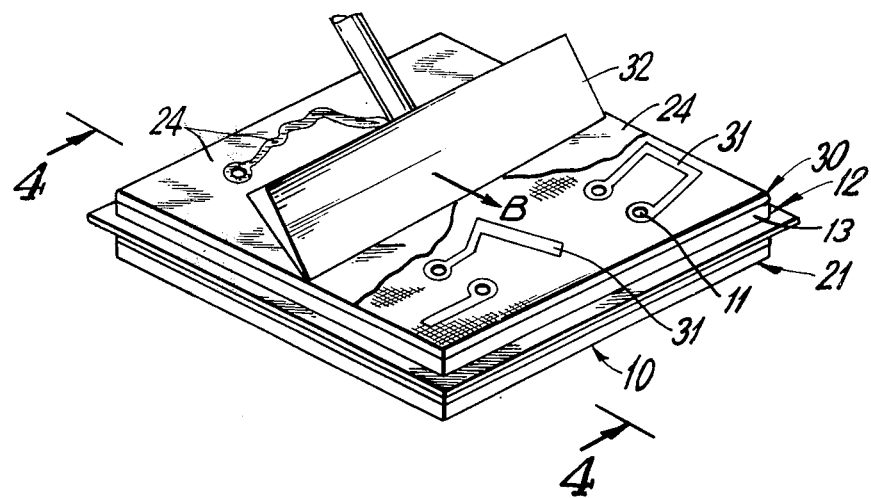
FIG. 3 is a perspective view of the silk screen, substrate and apparatus joined together and having ink applied over the screen by a squeegee.

Referring now to FIGS. 1 and 3, there is shown an apparatus, designated generally by the numeral 10, for coating a plurality of thru holes 11 in a printed wiring board substrate 12 with a liquid, such as ink. Printed wiring board substrate 12, which is typically made of a steel blank 13 on which epoxy 14 is coated, has a plurality of thru holes 11 drilled through the substrate 12 to serve as paths for electrical connections between printed wiring circuits appearing on the upper 15 and lower 16 surfaces of substrate 12.

A typical steel blank 13 is 30 mils (0.762 mm) thick and has thru holes 11 drilled in it prior to being coated with epoxy 14. The epoxy 14 coating can be applied by dipping the drilled steel blank 13 into a bath of epoxy which results in a coating approximately 15 mils (0.341 mm) thick becoming affixed to the surfaces of the blank 13 as seen in FIG. 2. The thru holes drilled in steel blank 13 are also coated with epoxy 14 and the resultant typical thru holes 11 have a diameter of 43 mils (1.09 mm). Also, when the epoxy 14 coating surrounding each thru hole 11 dries, there is formed a lip, or crater 17, which is a slight indentation in the upper 15 and lower 16 surfaces of the substrate surrounding each thru hole 11 and is typically no more than 15 mils (0.341 mm) deep and 75 mils (1.905 mm) in diameter. The epoxy coated blank 13 is usually then located in a frame 18 (FIG. 3) for support during the operations described below.

The coating apparatus 10 (FIG. 1) is comprised of a base 21 which is approximately the same length and width as the substrate 12. A plurality of cylindrical pins, or fingers 22, extend vertically from base 21 and are located on the base 21 such that each finger 22 is aligned with a corresponding thru hole 11 in substrate 12 (as shown by the dotted lines in FIG. 1). Fingers 22 have a diameter which is slightly less than the diameter of the corresponding thru hole 11 with which it is aligned, so that each finger 22 fits snugly into its associated hole 11. In one example, typical thru holes 11 have a diameter of 43 mils (1.092 mm), and the fingers 22 have a diameter of 40 mils (1.016 mm). The length of fingers 22, that is the distance from the head 23 of finger 22 to base 21 (shown as L in FIGS. 1, 5 and 6) is no greater than the thickness of the printed circuit substrate 12 (shown as W in FIGS. 1, 5 and 6). Typically, a substrate is 60 mils (1.524 mm) thick and thus finger 22 is no longer than 60 mils (1.524 mm) long.

An initial step in the manufacture of printed wiring boards is applying an inked circuit configuration to the upper surface 14 of substrate 12. The ink 24 (FIG. 3) which is applied acts as an adhesive catalyst for accelerating the plating of copper onto the substrate surface during a later manufacturing step. A type of ink 24 used can be purchased from the S. Robinson Co. of Westfield, NJ, under the trade name CC-4Ink.

A silk screen 30, containing thin, or open screen areas 31 representing the circuit configuration to be applied to surface 15, is placed over surface 15 as seen in FIG. 3 prior to application of the ink 24. The desired circuit configuration is formed on silk screen 30 by painting an emulsion (usually a polyvinyl alcohol) over the screen in the areas where ink is to be prevented from flowing through the screen. The painted, or thick screen areas, define the clear, or thin, screen areas 31, which represent the desired circuit configuration.

Figure 4:
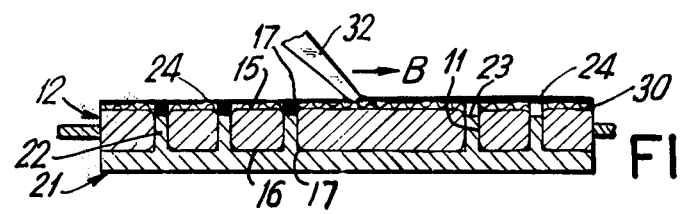
FIG. 4 is a fragmentary vertical section along lines 4—4 of FIG. 3, illustrating the location of the fingers within the thru holes and with ink in some of the craters of the thru holes.

As seen in FIGS. 3 and 4, screen 30 is aligned over the upper surface 15 of substrate 12 such that the thin screen areas 31 are located over the positions on the surface 15 where the circuit configuration is to be applied. Since thru holes 11 are to contain electrical connections and are part of the circuit configuration, thin screen areas 31 are located over the thru holes 11.

Base 21 of apparatus 10 is also brought into contiguous relationship with lower surface 16 of substrate 12, with each finger 22 inserted into its corresponding thru hole 11 prior to application of the ink 24. FIG. 4, which is a break away view of the assembly of FIG. 3 along lines 4—4, shows fingers 22 inserted into holes 11.

Since the length L of each finger 22 is no greater than the thickness W of substrate 12, head 23 of each inserted finger 22 is adjacent to, that is either flush with, or lower than, the upper surface 15 of substrate 12. In actual practice, it has proven more desirable to have each finger slightly shorter than the width of the substrate, as seen in FIG. 4, such that head 23 of inserted finger 22 is slightly lower than the upper surface 15 of substrate 12 and is flush with the bottom of each crater 17, as seen in FIG. 3 and more clearly in FIG. 5.

With fingers 22 fully inserted into corresponding thru holes 11 as seen in FIGS. 3 and 4, ink 24 is applied to screened upper surface 14 of substrate 12. A typical method of applying ink 24 is by moving a squeegee 32 over inked screen 30, but any ink application method may be used.

Squeegee 32 is made from rubber and is shaped like a wiper blade with the sharp edge of the blade in contact with the surface of the screen 30 as seen in FIG. 4. As squeegee 32 passes along, ink 24 is squeezed down thru the thin screen areas 31 onto the surface 15 and into craters 17, which also lie under thin screen areas 31. The painted portions of the screen prevents the ink from flowing through the screen in the thick screen areas.

In FIG. 4, squeegee 32, moving from left to right in the direction of arrow B, has applied ink 24 to the three leftmost thru holes 11 in which fingers 22 have been inserted. When this is done a puddle, or pond 33, of ink is formed in each crater 17 on top of the head 23 of each inserted finger 22 which is best seen in FIG. 5.

After squeegee 32 has applied ink 24 to the entire upper surface 15 of substrate 12 through screen 30, the screen 30 is removed. The inked circuit configuration has now been applied to the top surface 15, but the walls 41 (FIG. 5) of the thru holes 11 have not as yet been coated with ink 24.

Figure 5:
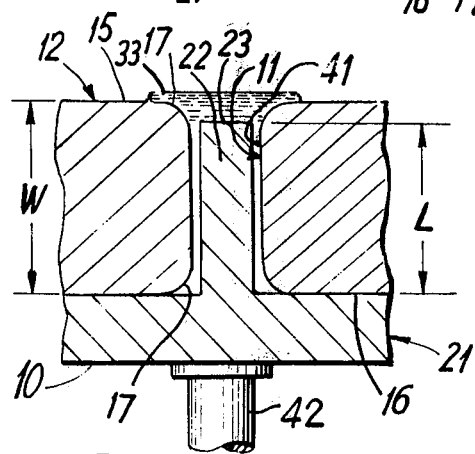
FIG. 5 is an enlarged view of a thru hole, with the finger inserted after the ink has been applied to the substrate.
Figure 6:
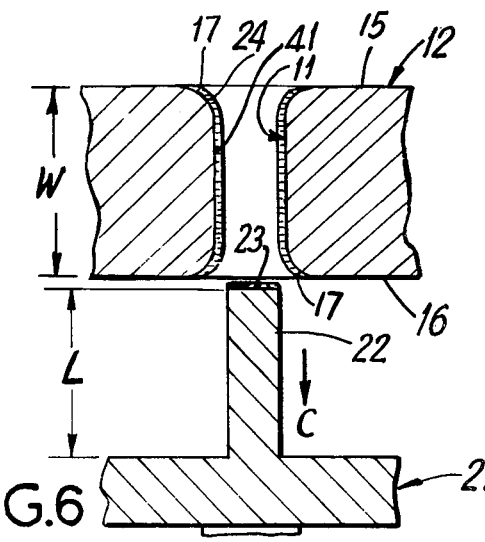
FIG. 6 is an enlarged view of a thru hole, with the finger removed and the walls of the thru hole coated with ink.

In order to coat walls 41, apparatus 10 is now moved down in a uniform motion in the direction of arrow C, FIGS. 5 and 6, away from the bottom surface 16 of substrate 12. Apparatus 10 can be moved down by any arrangement well known in the art, such as an air cylinder 42 (FIG. 5), arranged to impart a uniform downward movement. As apparatus 10 moves down, the fingers 22 are withdrawn from the thru holes 11 thereby sucking, or drawing, ink from the puddle 33 down into the hole and thus coating the walls 41 with ink 24 from the puddle 33. Additionally, inked heads 23 also coats the walls 41 by applying or painting ink directly onto the walls 41 as they move down the associated thru holes 11. FIG. 6 shows a typical finger 22 completely withdrawn from hole 11 and the walls 41 of the hole coated with a film of ink 24.

With fingers 22 completely withdrawn from thru holes 11 (FIG. 6), the walls 41 are completely coated with ink 24 and the inked substrate 12 is now ready for the next step in the printed wiring board manufacturing process. The walls 41 have been coated with ink during the ink screening step in the process and thus the "ball printing" step used in the prior art has been eliminated from the manufacturing process. Also, the walls 41 are now coated with a heavier deposit of ink 24 than that accomplished in the "ball printing" step.

Figure 7:
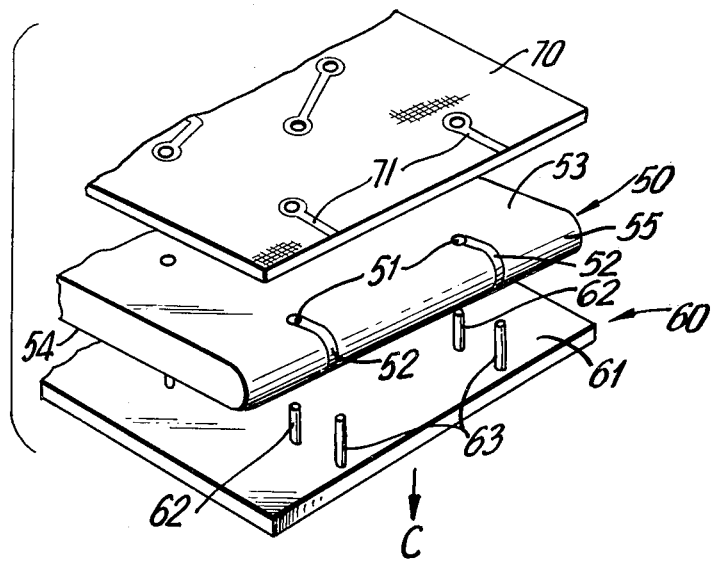
FIG. 7 is a perspective view of a silk screen, substrate with edge connections and an apparatus for coating the walls of thru holes formed in the substrate and the edge of the substrate where the connections are located.

FIG. 7 shows substrate 50 having thru holes 51 and edge connections 52 for interconnecting circuits appearing on the top 53 and bottom 54 surfaces of the substrate. Edge connections 52 extend around curve shaped edge 55 of substrate 50. As with the thru hole connections described above, edge connections 52 must be entirely coated with ink 24 around edge 55 in order to achieve a good electrical connection during a later step in the printed wiring board manufacturing process.

Apparatus 60, in FIG. 7, is similar to apparatus 10 described above in that it has a base 61 and fingers 62 extending vertically from the base which fingers are located on the base so as to aligned with corresponding thru holes 41 in substrate 50 and are shaped for insertion into the thru holes. However, apparatus 60 is slightly longer than substrate 50 and has two additional fingers 63 located on base 61 to be aligned with edge 55 and positioned to contact edge 55 at the two connections 52 when fingers 62 are inserted into thru holes 51.

Figure 8:
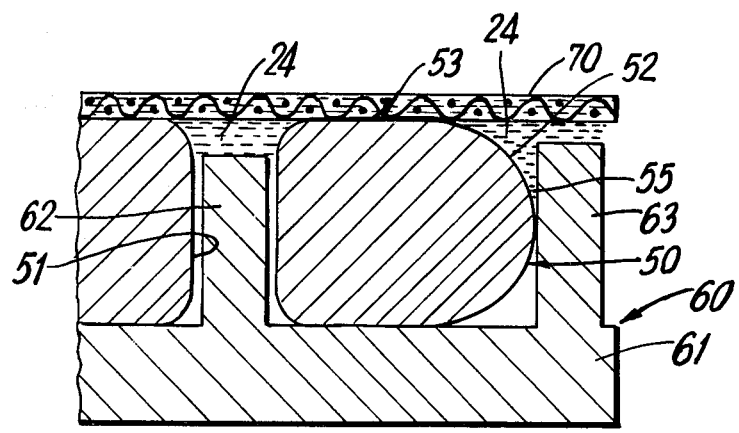
FIG. 8 is an enlarged view of a thru hole with a finger inserted therein and of an edge connection and aligned finger after the substrate has had ink applied to it.

Edge connection fingers 63 are typically slightly longer than thru hole fingers 62 as seen in FIG. 8. In FIG. 8, a silk screen 70, which is also slightly longer than substrate 50 in order to accommodate thin screen areas 71 associated with edge connections 52 (best seen in FIG. 7), has been placed over the top surface 53 of substrate 50 and ink 24 has been squeegeed onto the surface. As viewed in FIG. 8, ink 24 now sits on top of thru hole finger 62, is coated on the land areas associated with edge connection 52 and is also coated on the sides and top of edge connection finger 63 since finger 63 extends above edge 55 of substrate 50.

As inserted apparatus 60 is removed from substrate 50, (direction of arrow C), thru hole fingers 62 draw ink 24 into the associated thru holes 51 as described in detail above, while edge connection fingers 63, whose top and sides have been coated with ink, now coat the edge 55 of substrate 50 at the locations of edge connections 52. Thus edge 55 is now coated with ink 24 at the selected positions.

To insure that edge 55 and the walls of thru holes 51 have been coated with ink, apparatus 60 can be inserted into substrate 50 and the above procedure repeated when an inked circuit configurations is being applied to bottom surface 54 of substrate 50. To apply an inked circuit configuration to bottom surface 54, bottom surface 54 is placed in the upper position, that is substrate 50 is turned upside down so that bottom surface 54 is positioned where surface 53 is now shown in FIG. 7. A silk screen 70 is than aligned over the surface 54, apparatus 60 is inserted into substrate 50 and ink is squeegeed onto the surface 54 through the screen 70. Apparatus 60 is then removed from the substrate thereby drawing ink down into the thru holes 51 and coating the edge 55 thus insuring that the entire walls of thru holes 51 and edge 55 are coated with ink 24.

If the ink 24 used is thick and does not easily flow (has a high coefficient of viscosity), a vacuum producing arrangement may be attached to lower surface 15 of substrate 12 (FIG. 1) after the removal of apparatus 10 to further suck the slow moving ink 24 through the holes 11 thereby coating the walls 41. However, most inks 24 used in the manufacture of printed wiring boards will not require the application of a vacuum to further move the ink down the thru hole, since the movement of fingers 22 will be sufficient to draw ink 24 into thru holes 11 for coating the walls 41 of the thru holes.

While specific examples and embodiments of the invention have been described in detail hereinabove, it should be obvious that various modifications may be made from the specific details, steps and materials described without departing from the spirit and scope of the invention.

What is claimed is:

1. A method of coating the walls of a thru hole formed in a substrate with a liquid, which comprises:
   (a) inserting a close-fitting, undersized pin into the hole so that a front end of the pin is positioned adjacent to a first surface of the substrate; next
   (b) applying the liquid to portions of the first surface inluding the area about the hole and the front end of the pin; and then
   (c) withdrawing the pin from the hole so that the liquid is drawn by the pin into the hole and coats the walls of the hole with a film of the liquid.

2. A method for coating the walls of a thru hole as recited in claim 1, wherein the thru holes are circular and the pin is cylindrical with the front end having a flat head.

3. A method for coating the walls of a thru hole as recited in claim 2, wherein the flat head of the inserted undersized pin is 15 mils (0.341 mm) below the first surface.

4. A method for coating the walls of a thru hole as recited in claim 2, wherein the diameter of the cylinder pin is 3 mils (0.076 mm) less than the diameter of the circular thru hole.

5. A method for coating the walls of a thru hole as recited in claim 1, wherein the area about the hole in the first surface of the substrate is shaped like a crater and a puddle of the liquid is formed in the crater during the applying step.

6. A method for coating the walls of a thru hole with a liquid as recited in claim 1 comprising the additional step of:
   positioning a silk screen, having thin screen areas representing a circuit configuration, over the first surface of the substrate prior to applying the liquid.

7. A method for coating the walls of a thru hole with a liquid as recited in claim 6, wherein the liquid is applied by moving a squeegee over the silk screen thereby squeezing the liquid through the thin screen areas onto the first surface of the substrate.

8. A method of coating a thru hole in a substrate as recited in claim 1, wherein the substrate has a plurality of thru holes formed therein and wherein a plurality of close-fitting undersized pins are inserted into the plurality of holes prior to applying the liquid and withdrawing the pins.

9. A method of coating a thru hole in a substrate as recited in claim 1, wherein the method further comprises placing a pin alongside a preselected location on the edge of the substrate so that the front end of the pin is adjacent to the first surface of the substrate; and after the applying step withdrawing the pin so that the wet front end of the pin paints liquid onto the preselected location on the edge of the substrate as it is being withdrawn.

10. A method of applying ink to selected portions of a printed circuit substrate, including the uniform coating of a plurality of thru holes formed in the substrate and coating selected portions of the edges of the substrate, which method comprises the steps of:

moving an applicator member, having a plate and a plurality of fingers mounted on the plate, some of the fingers being located on the plate so that the fingers are aligned with the plurality of thru holes in the substrate and others of the fingers are aligned with the selected portions of the edges of the substrate, against a bottom surface of the substrate such that some of the fingers are inserted into the thru holes and the others of the fingers are placed adjacent to the selected portions of the edges of the substrate; applying ink to a top surface of the substrate including the tops of the plurality of fingers; and retracting the applicator member from the substrate so that the inserted fingers draw the liquid into the holes coating the walls of the plurality of holes with a liquid as the fingers are retracted and the other fingers coat the selected portions of the edge of the board as the inked tops of the fingers are retracted.

* * * * *